US005446618A

United States Patent [19]

Tetsuya et al.

[11] Patent Number: 5,446,618

[45] Date of Patent: Aug. 29, 1995

[54] PERSONAL COMPUTER SECURITY APPARATUS WITH LOCKABLE SLIDES ENGAGING REMOVABLE COVER

[75] Inventors: Ohtani Tetsuya; Yokohama; Yoshiharu Uchiyama, Isehara; Hideo Nomura, Yokahama, all of Japan

[73] Assignee: International Business Machines Corporation, Armonk, N.Y.

[21] Appl. No.: 122,871

[22] Filed: Sep. 16, 1993

[30] Foreign Application Priority Data

Sep. 16, 1992 [JP] Japan .................................. 4-246292

[51] Int. Cl.[6] .......................... G06F 1/16; H05K 5/02; E05B 73/00; B65D 55/02

[52] U.S. Cl. .................................... 361/683; 361/726; 361/740; 70/58; 292/307 R; 292/148

[58] Field of Search .................................... 364/708.1; 248/551-553; 312/216, 218; 70/57, 58, 85; 292/42, 148, 151, 307 R; 361/683-686, 724-727, 740, 759

[56] References Cited

U.S. PATENT DOCUMENTS

| | | | |
|---|---|---|---|
| 4,777,812 | 10/1988 | Haagen | 70/57 X |
| 4,941,841 | 7/1990 | Darden et al. | 361/685 |
| 5,051,868 | 9/1991 | Leverault et al. | 361/685 |
| 5,154,456 | 10/1992 | Moore et al. | 70/58 X |
| 5,228,319 | 7/1993 | Holley et al. | 70/58 |

*Primary Examiner*—Michael W. Phillips
*Attorney, Agent, or Firm*—Martin J. McKinley

[57] ABSTRACT

A computer with a removable cartridge type hard disk drive (14) or other removable device includes a three position slider 26. At one end of the slider is a tab (20A) having a hole (20B) for receiving a lock. When the slider is in a first position, the tab is retracted within the computer housing (2) and the disk drive can be easily removed from the computer. When the slider is in a second position, the tab protrudes from the housing and the disk drive cannot be removed from the computer. In the second position and with the tab protruding from the housing, a padlock can be inserted into the hole in the tab to secure the slider in the second position, thereby locking the disk drive in the computer. When the slider is in the third position, the tab does not protrude from the housing, but the disk drive cannot be removed from the computer.

3 Claims, 7 Drawing Sheets

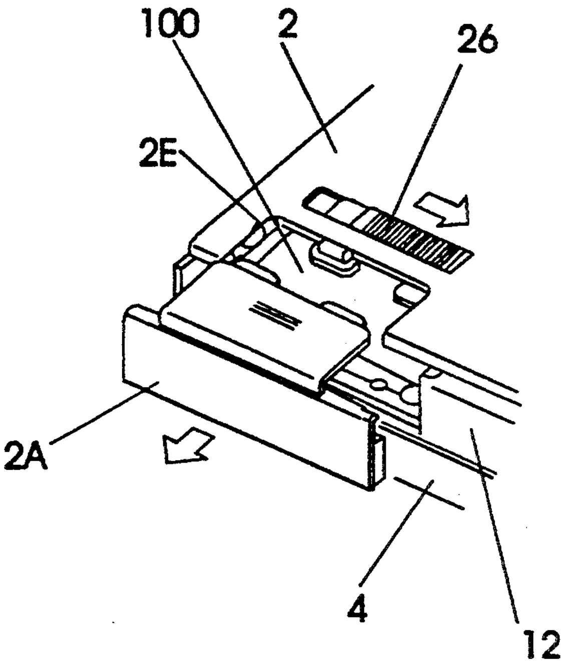
FIG. 11
FIG. 12
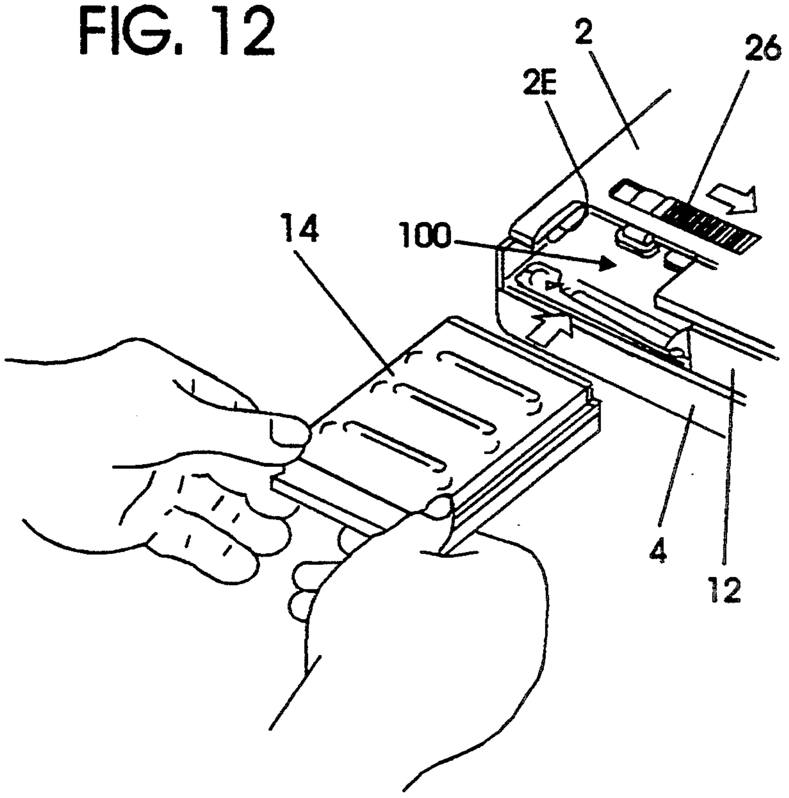

PERSONAL COMPUTER SECURITY APPARATUS WITH LOCKABLE SLIDES ENGAGING REMOVABLE COVER

BACKGROUND of the INVENTION

Pursuant to 35 U.S.C. 119, Applicants claim the benefit of the filing date of Japanese Application No. 4-246292, which was filed on Sep. 16, 1992. This Japanese Application and its translation are wholly incorporated by reference herein.

This invention pertains to personal computers and, more particularly, to a security mechanism for a removable device, such as a cartridge type disk drive, wherein the security mechanism inhibits the unauthorized removal of the device from the computer.

Removable cartridge type hard disk drives (HDD's) and other removable devices are well known and, generally, they are easy to install and remove from a computer. Unfortunately, the cartridge (the term "cartridge" is used throughout this application to refer to any removable type device, such as a removable hard disk drive) can easily be removed by an unauthorized user, such as in the case of a simple theft; or the cartridge can also be easily removed, the confidential information stored in the cartridge copied, and the cartridge returned to computer without the owner's knowledge.

Therefore, it is an object of the invention to provide a computer security mechanism that inhibits the unauthorized removal of an otherwise removable type device. It is also an object of the invention to provide a means for securing the computer, via a cable, chain or the like, to a stationary fixture, such as a wall. It is a further object of the invention to inhibit the unauthorized removal of the device from the computer when the computer is attached to the stationary fixture, while permitting the easy removal of the device when the computer is not secured to the stationary fixture.

SUMMARY OF THE INVENTION

Briefly, the invention is a computer for use with a lock and a removable device, such as a cartridge type hard disk drive. The computer includes a housing and a means for receiving the removable device. A movable member has first and second positions. The device is removable from the receiving means when the movable member is in the first position, and the device is non-removable from the receiving means when the movable member is in the second position. The movable member includes a first portion having a hole for receiving a lock. The movable member is inhibited from being moved from the second to the first position when the lock is inserted into the hole of the first portion of the member.

BRIEF DESCRIPTION OF the DRAWINGS

FIG. 11 is a bottom perspective view illustrating the removal of the cover from the computer.

FIG. 12 is a bottom perspective view illustrating the installation of a cartridge type hard disk drive into the computer.

DESCRIPTION OF THE ILLUSTRATIVE EMBODIMENTS

Figure 1:
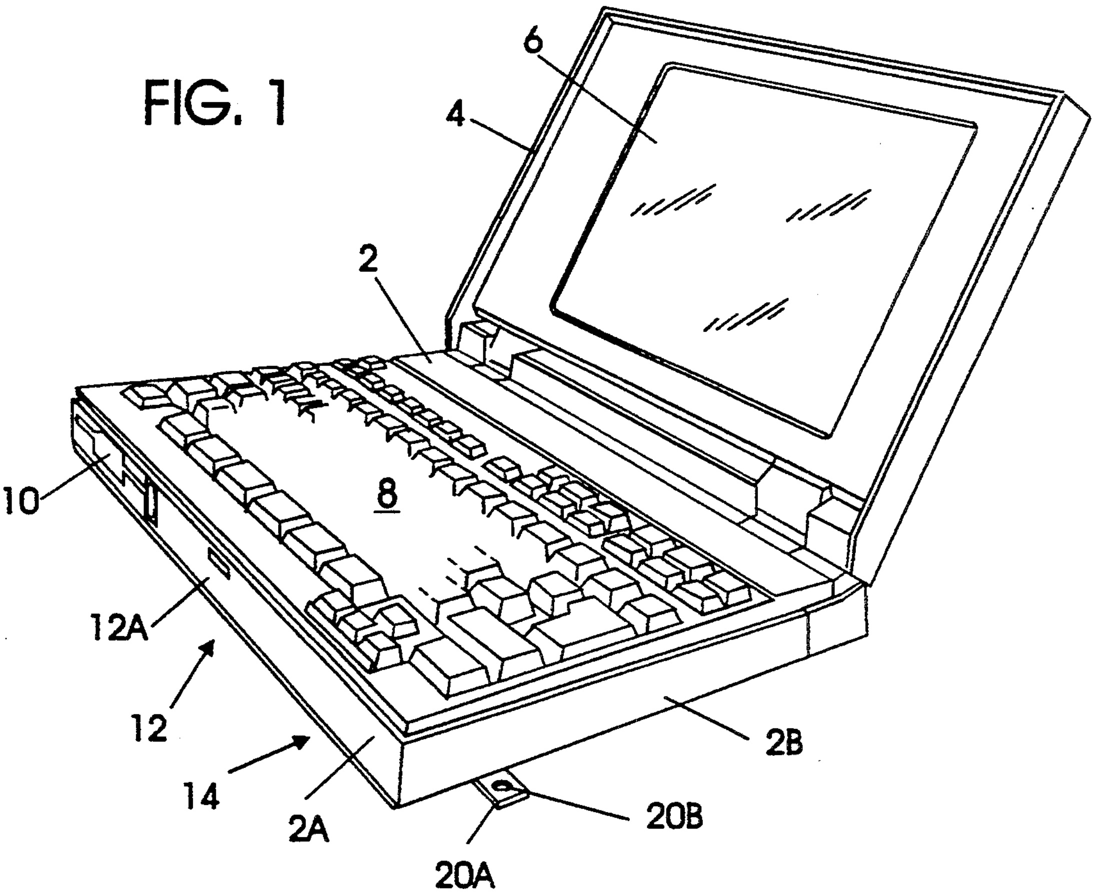
FIG. 1 is a top perspective view of a personal computer according to the present invention.

Referring to FIG. 1, a computer housing 2 includes a lid 4, a keyboard 8 and, on the inside surface of the lid, a flat panel display 6. Arranged from left to right along the front side of the housing 2 are a non-removable floppy disk drive (FDD) 10, a removable battery 12, and a hard disk drive (HDD) 14. The battery is behind the center section 12A of the front side of the housing 2. The HDD 14 is of the cartridge type and can be easily removed from the computer by the user. A cover 2A, which forms one of the end sections of the front side of the computer covers the HDD 14. A tab 20A having a hole 20B protrudes from the right side 2B of the computer. A padlock (not shown) can be inserted into the hole 20B to secure the HDD 14 in the computer. In addition, a cable, chain or the like can be inserted into the hole and the other end of the cable or chain secured to a stationary (relative to the computer) fixture. This later arrangement not only secures the computer to the stationary fixture, but also serves to lock the HDD 14 and cover 2A in place. Hereinafter, the term "lock" will be used in the specification and claims to describe any device, apparatus or instrument (such as, but not limited to, the aforementioned padlock, cable and chain) that can be inserted into the hole 20B to secure, lock or otherwise inhibit the removal of the HDD 14 or any other removable device from the computer.

Figure 2:
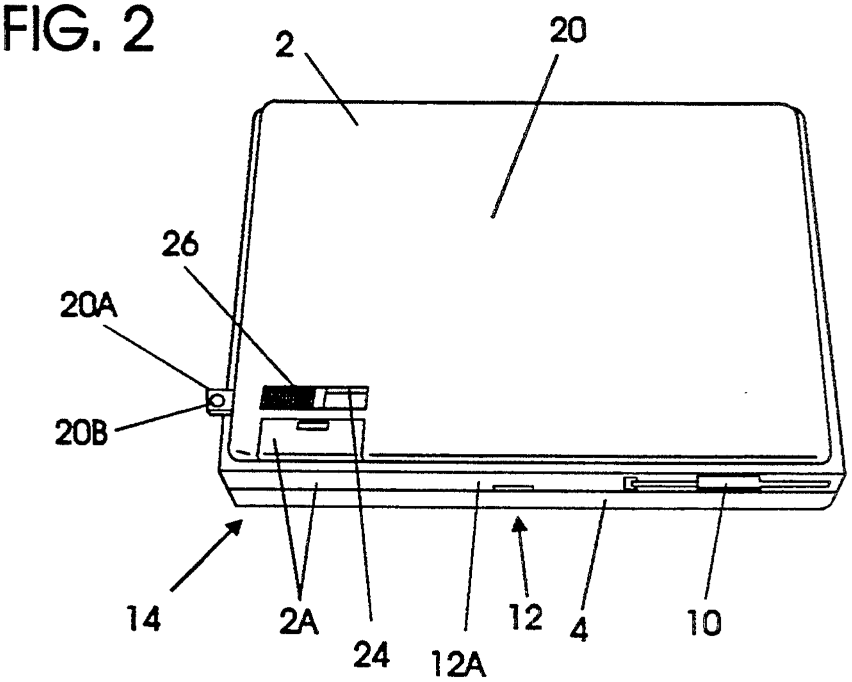
FIG. 2 is a bottom perspective view of the computer.

Referring to FIG. 2, a slider 26 is positioned in an opening formed in the bottom surface 2C of the housing 2. The slider 26 can freely slide in the longitudinal direction of the opening 24. The slider opening 24 is covered with the slider 26 regardless of the current position of the slider 26.

Figure 3:
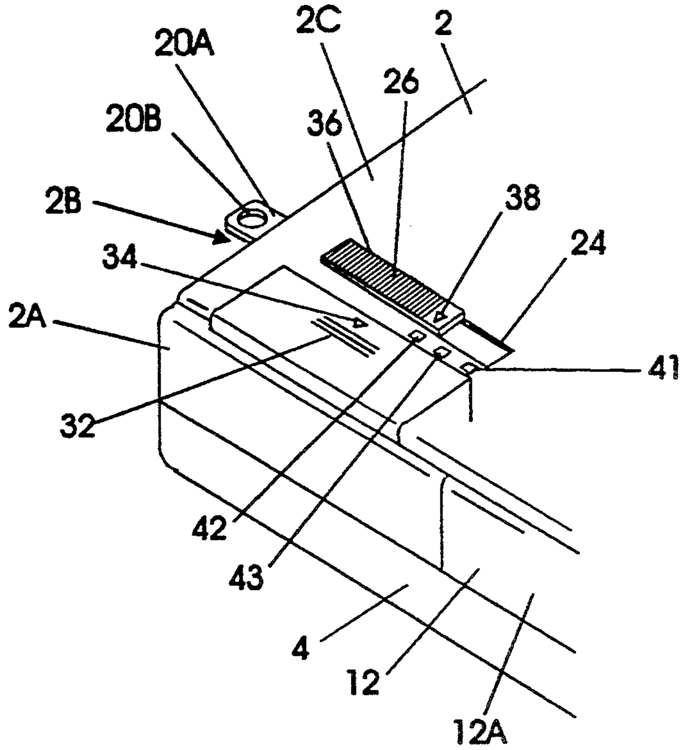
FIG. 3 is a bottom perspective view of one corner of the computer showing the slider in the second position.
Figure 4:
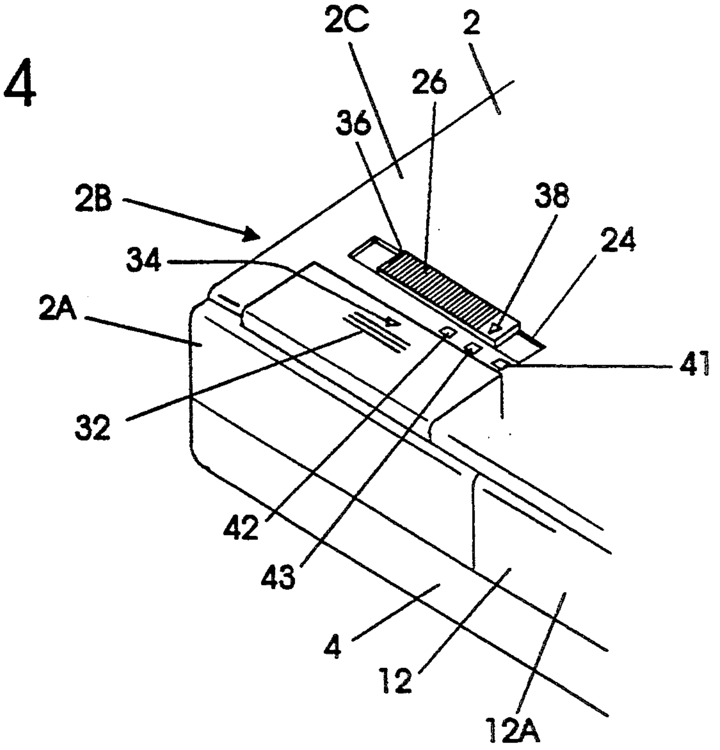
FIG. 4 is similar to FIG. 3, except that the slider is illustrated in the third position.
Figure 5:
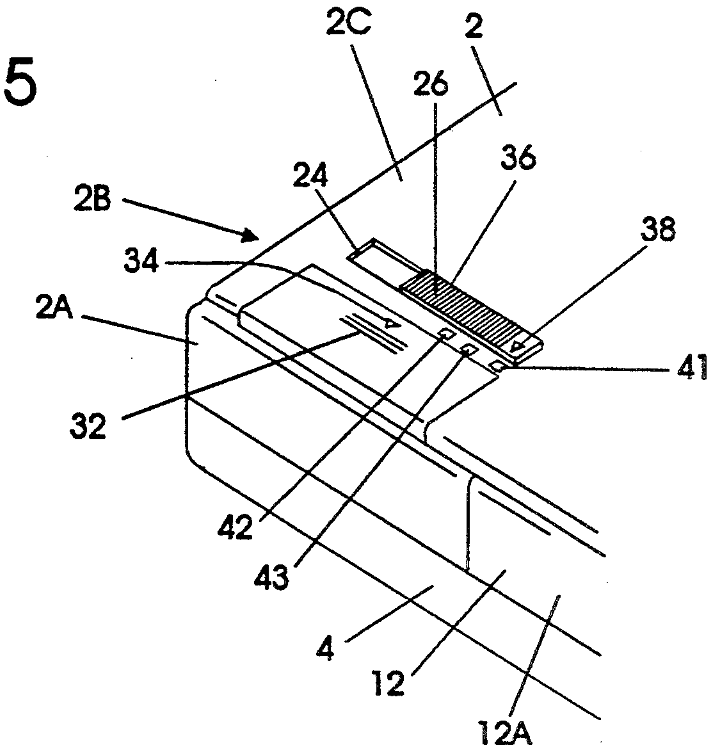
FIG. 5 is similar to FIG. 3, except that the slider is illustrated in the first position.

Referring to FIGS. 3-5, the cover 2A is, in cross sections shaped with a first part of the cover forming a portion of the front side of the housing 2, while the second part forms a portion of the bottom surface 2C of the housing. A frictional surface 32 is machined on the second part of the cover 2A to aid in the removal of the cover, which can be pulled from the housing 2 in the direction of arrow 34.

A frictional surface 36 and arrow 38 are also formed on the surface of the slider 26. A first mark 41, a second mark 42 and a third mark 43 are located on the bottom surface 2C of the housing. These marks are aligned in the direction of movement of slider 26. The first mark 41 is farthest from the side 2B; the second mark 42 is closest to the side 2B; and the third mark 43 is located between the first and second marks.

In FIG. 5, the slider is in a first position wherein the arrow 38 is adjacent the first mark 41. With the slider 26 in the first position, the cover 2A can be removed from the housing 2 and the tab 20A is withdrawn into the housing.

In FIG. 3, the slider 26 is in a second position wherein the arrow 38 is adjacent the second mark 4,2. With the slider 26 in the second position, the cover 2A cannot be removed from the housing 2 and the tab 20A protrudes from the housing 2. As described in more detail below, the slider 26 is attached to the tab 20A. If, for example, a padlock, cable or chain (not shown) is inserted into the hole 20B in the tab, then the tab 2A is inhibited from withdrawing into the housing 2 and the slider 26 will be locked in the second position. In other words, the slider cannot be moved to the first position as long as a padlock or similar device is positioned in the hole 20B; thereby preventing the cover 2A from being removed from the housing 2.

In FIG. 4, the slider 26 is in a third position wherein the arrow 38 is adjacent the third mark 43. With the slider 26 in the third position, the cover 2A cannot be removed from the housing 2. In this position, however, the tab 2B does not protrude from the housing 2, thereby preventing the use of a padlock or other device to lock the slider 26 in the third position. Consequently, the cover 2A can be removed from the housing by simply moving the slider 26 from the third to the first position and pulling the cover out.

Figure 6:
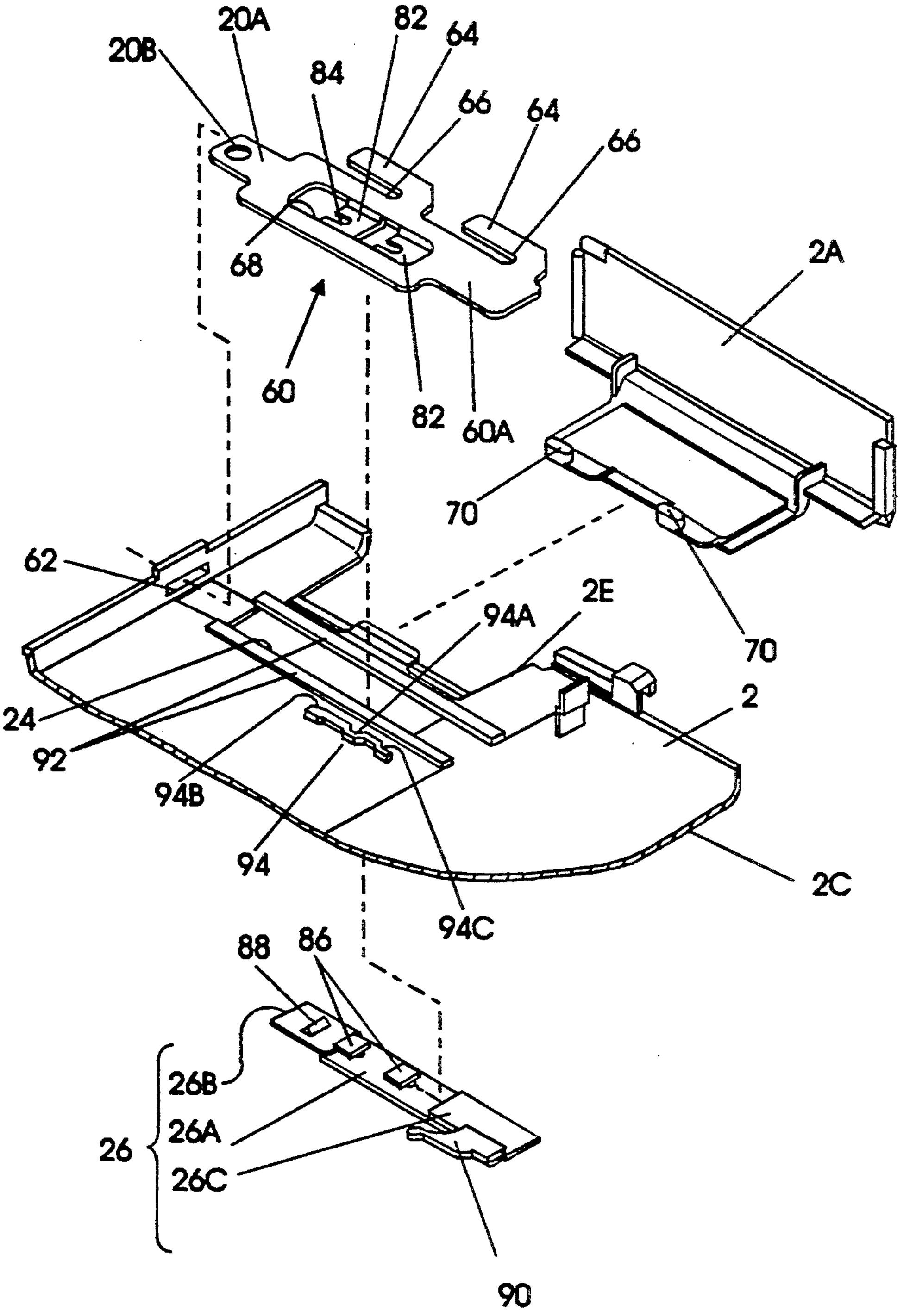
FIG. 6 is an internal, exploded perspective view that illustrates the construction of the slider mechanism, computer housing 2 and removable cover 2A.

In FIG. 6, the cover 2A has been removed from the housing 2A, thereby exposing an opening 2E. The security mechanism includes a movable plate 60, which is preferably made of a metallic material. The tab 20A is formed at one end of the plate 60 and a slot 62 is formed in the housing 2 to receive the tab. Two arms 64 are formed at the other end of the plate 60 and a slot 66 is formed between each arm and the body 60A of the plate. Two protuberances 70 are formed on the cover 2A and, when the protuberances are engaged in the slots 66 of the plate, the cover is inhibited from being removed from the housing 2.

Formed in the body 60A of the plate 60 is an opening 68 for fitting, and formed in the fitting opening 68 are slider fitting sections 82. Formed in each of the slider fitting sections 82 is a slider fitting notch section 84 to which a protuberance 86 for attaching the slider 26 is to be attached. The top end of the protuberance 86 is widened so as to prevent it from coming off the slider fitting notch section 84. On the slider 26 a stopper 88 is formed. The stopper 88 contacts one end of the fitting opening 68 for attaching so as to prevent the slider attaching protuberance 86 from coming off the slider fitting notch section 84 by restricting the movement of the slider 26 relative to the plate 60 after the slider attaching protuberance 86 is fitted in the slider fitting notch section 84.

The slider 26 is preferably made of plastic material. The slider 26 is composed of the body 26A and end sections 26B and 26C at both ends of the body 26A. The width of the body 26A of the slider 26 is larger than that of the slider opening 24 of the bottom surface 2C of the body 2, and therefore the slider 26 cannot be fitted in the slider opening 24 unless it slants into the opening 24. The widths of the end sections 26B and 26C of the slider 26 are slightly smaller than the width of the slider opening 24 so that it can slide in the opening 24.

On both edges of the slider opening 24 on the inside of the bottom surface 2C rails 92 are formed. The end sections 26A and 26B of the slider 26 are slidably caught between two rails 92 so that the slider 26 can be guided by the rails 92. The width of the body 26A of the slider 26 is larger than a distance between two rails 92 so that the slider 26 is prevented from coming off and falling to the inside of the body 2. The end section 26C of the slider 26 contacts a spring 90. On the other hand, fixed to the inside of the bottom surface 2C is a stopper 94.

Figure 7:
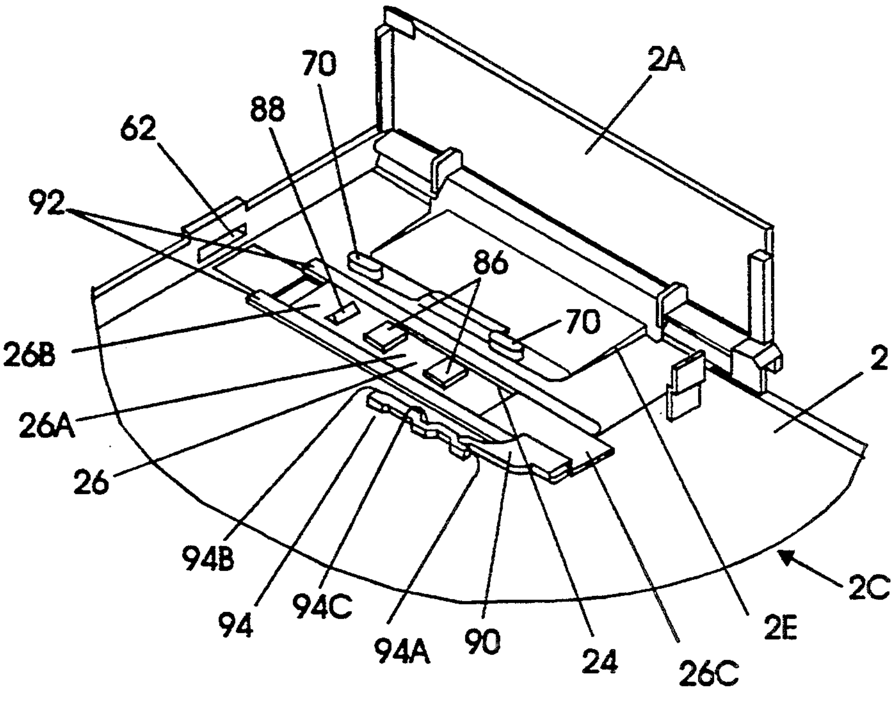
FIG. 7 is an internal perspective view of the slider mechanism (less the plate 60), computer housing and cover.

FIG. 7 shows the state where the slider 26 is fitted in the slider opening 24 and the cover 2A is attached to the HDD ejecting section 2E. The plate 60, which is a movable member, is removed from the slider 60. The cover 2A is fitted in the HDD ejecting section 2E when the edges of the cover 2A are detachably engaged with those of the HDD ejecting section 2E. The cover 2A can be removed from the HDD ejecting section 2E by pulling it to the right in the figure.

As the slider 26 slides along the rail 92, the top end of the spring 90 slides on the stopper 94 accordingly. Formed on the stopper 94 are three concavities 94A, 94B, and 94C arranged in the direction of movement of the slider 26. When the slider 26 slides and the top end of the spring 90 reaches the concavities 94A, 94B, or 94C accordingly, the above top end engages with any of the concavities 94A, 94B, and 94C, the top end being able to go freely out of it, thereby the slider 26 stops sliding. That is, the slider 26 stops with a click when it slides to any of those positions.

Figure 8:
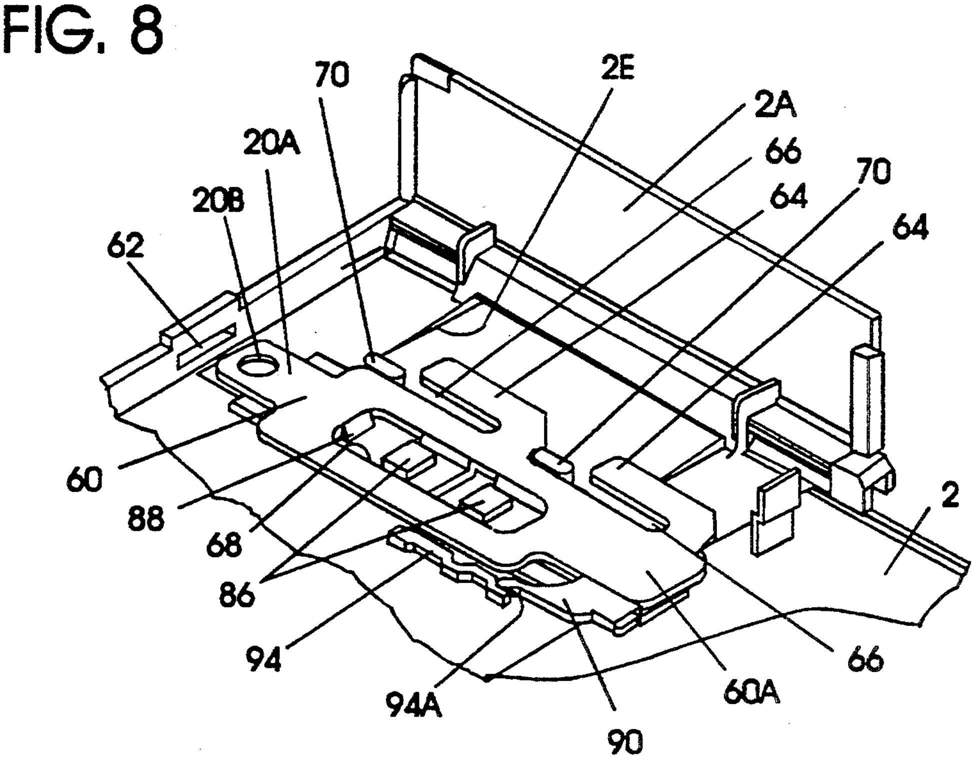
FIG. 8 is an internal perspective view of the slider mechanism, computer housing and cover wherein the slider mechanism is in the first position.

FIG. 8 shows a construction in a state that the plate 60 as a movable member is at the first position. This state corresponds to the state shown in FIG. 5. The engaging member 20A retracts from the through hole inside of the body 2. The top end of the spring 90 engages with the first concavity 94A of the stopper 94 and the slider 26, that is, the plate 60 stably stops at the first position. The protuberances 70 of the cover 2A are released from the slots 66 of the plate 60. Therefore, the cover 2A can be removed from the HDD ejecting section 2E. That is, a HDD can be taken out of the body 2.

Figure 9:
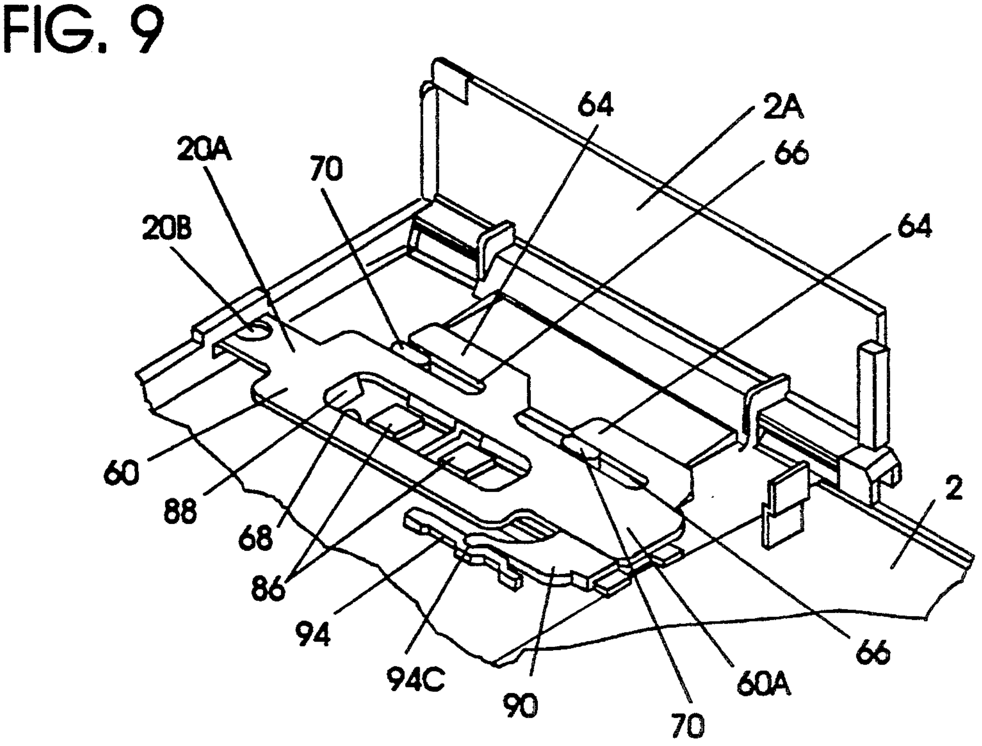
FIG. 9 is an internal perspective view of the slider mechanism, computer housing and cover wherein the slider mechanism is in the third position.

FIG. 9 shows a construction in a state that the plate 60 as a movable member is at the third position. This state corresponds to the state shown in FIG. 4. The engaging member 20A retracts from the through hole 62 and is not on the outside of the body 2. The top end of the spring 90 engages with the third concavity 94C of the stopper 94 and the slider 26, that is, the plate 60 stably stops at the third position. The protuberances 70 of the cover 2A are in the slots 66 and the cover 2A is locked by the plate 60. Therefore, the cover 2A cannot be removed from the HDD ejecting section 2E. That is, a HDD cannot be taken out of the body 2. However, since a chain or the like cannot be attached to the engaging member 20A in this state, the plate 60 can be moved to the first position (in the state shown in FIG. 8) by operating the slider 26.

Figure 10:
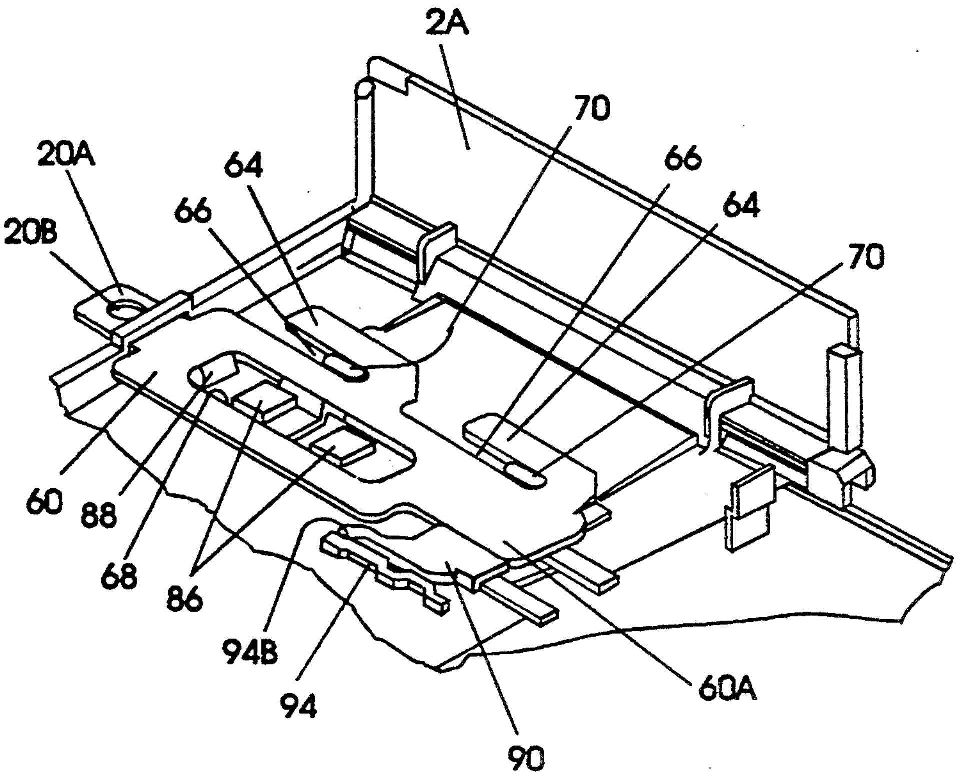
FIG. 10 is an internal perspective view of the slider mechanism, computer housing and cover wherein the slider mechanism is in the second position.

FIG. 10 shows a construction in a state that the plate 60 as a movable member is at the second position. This state corresponds to the state shown in FIG. 3. The engaging member 20A protrudes from the through hole 62 to the outside of the body 2. The top end of the spring 90 engages with the second concavity 94B of the stopper 94 and the slider 26, that is, the plate 60 stably stops at the second position. The protuberances 70 of the cover 2A are in the slots 66 of the plate 60 and the cover 2A is locked by the plate 60. Therefore, the cover 2A cannot be removed from the HDD ejecting section 2E. That is, a HDD cannot be taken out of the body 2. If a chain or the like is attached to the engaging member 20A protruding from the body 2, the plate 60 is prevented from being moved to the first position (in the state shown in FIG. 8) by operating the slider 26. Therefore, if a chain or the like is attached to the engaging member 20A protruding from the body 2, not only the body 2 is prevented from moving, but also a HDD is inhibited from being detached from the body 2.

FIG. 11 shows the state that the body 2 is placed bottom up, the slider 26 is moved to the left in the figure, that is, to the first position, and then the cover 2A is removed from the HDD ejecting section 2E of the body 2. After the cover 2A is removed, the enclosure section 100 for a HDD is exposed in the HDD ejecting 2E. FIG. 12 shows the insertion of the cartridge HDD 14 into the enclosure section 100 within the body 2. It is preferable that the enclosure section 100 is provided with guide rails (not shown) for guiding and holding the HDD 14.

After the HDD 14 is enclosed in the enclosure section 100 and the connector of the HDD 14 is surely engaged with that of the system body, the cover 2A is attached to the HDD ejecting section 2E. Then, when the slider 26 slides to the position shown in FIG. 2 (second position), the engaging member 20A protrudes from the body 2 so that a chain or the like can be attached to the engaging member 20A. The chain causes not only the slider 26 to be locked at the second position, but also the cover 2A to be locked in the body 2.

As described above, the embodiment has an advantage that when the chain is connected to the key hole 20B of the engaging member 20A so as to engage the body 2 itself with the external and proper fixed place, the cartridge HDD 14 is inhibited from being detached from the body 2.

Further, in said embodiment, the cover 2A was able to be easily removed as required by moving the slider 26 to the first position without causing the engaging member 20A to protrude from the body 2 by positioning the slider 26 to the third position. However, it will be appreciated that it is not necessarily required to provide the third position. In said embodiment, the cartridge HDD 14 was inhibited from being detached from the body 2 by preventing the cover 2A from being-removed, however, it will be appreciated that a detachable instrument such as the cartridge HDD or the like may be inhibited from being detached from the body through a direct action on the instrument instead of preventing the cover from being removed. It will be appreciated also that the cover may be, or may not be removed from the body, that is, may be merely opened.

Further, in said embodiment, a detachable instrument was the cartridge HDD 14, but it will be appreciated that the present invention may be applied not only to a memory such as a cartridge FDD, a cartridge IC memory, a card memory, or the like, but also to an instrument such as a battery pack, a communication instrument, or the like, other than storage unit. An object of said embodiment is a notebook personal computer, but it will be appreciated that the present invention may be applied to a portable type of information processing apparatus other than notebook type, or to an information processing apparatus other than portable type.

Further, in said embodiment, the engaging member 20A forms one end of the plate 60 as a movable member, but it will be appreciated that the engaging member and the movable member may be different pieces of members. Still further, in said embodiment, the plate 60 linearly moves as a movable member, but it will be appreciated that it may move between the first position and the second position drawing a circular arc. Still yet further, in said embodiment, the engaging member 20A can be engaged with the external place in the state that the engaging member 20A is pulled out of the body 2 so that it protrudes from the body 2, but it will be appreciate that the engaging member 20A may be engaged with the external place in the state that it does not necessarily protrude from the body 2, and a chain or the like may be attached in the state that the engaging member does not protrude from the body 2. It will be appreciated also that one movable member may allow a plurality of instruments or a plurality of covers for a plurality of the instruments to be inhibited from being detached or opened.

We claim:

1. A computer having a security device, comprising:
 - a housing, wherein said housing includes an aperture for receiving a removable device;
 - means disposed within said housing for receiving the removable device;
 - a cover removably mounted over said aperture for blocking access to the removable device via said aperture;
 - a movable member adapted to engage said cover; said movable member movable between first and second positions, said movable member including a hole within a portion of said movable member for receiving a lock; and
 - a lock, wherein when said lock is fastened through said hole, said movable member is locked in said second position, said movable member is engaged with said cover so that said cover is prevented from being removed, and said housing is securable to a fixture to which said lock is attachable.

2. The computer of claim 1 wherein said portion of said movable member is retracted within said housing when said movable member is in said first position, and wherein said portion of said movable member protrudes from said housing when said movable member is in said second position.

3. The computer of claim 2, wherein said movable member slides within a slot and is movable to a third position in which said movable member is engaged with said cover so that said cover is prevented from being removed and all of said movable member is retracted within said housing, and wherein said movable member includes a spring arm extending from said movable member to contact a surface interior to said housing and parallel to said movable member, said surface including first, second, and third detents defining said first, second, and third positions, respectively, wherein said movable member is retained in one of said first, second, and third positions by frictional contact between said spring arm and said surface at one of said first, second, and third detents respectively.

* * * * *